(12) United States Patent
Ishibashi et al.

(10) Patent No.: US 7,160,748 B2
(45) Date of Patent: Jan. 9, 2007

(54) METHOD FOR FABRICATING NITRIDE SEMICONDUCTOR, METHOD FOR FABRICATING NITRIDE SEMICONDUCTOR DEVICE, AND NITRIDE SEMICONDUCTOR DEVICE

(75) Inventors: Akihiko Ishibashi, Osaka (JP); Ayumu Tsujimura, Osaka (JP); Yoshiaki Hasegawa, Osaka (JP); Nobuyuki Otsuka, Hyogo (JP); Gaku Sugahara, Nara (JP); Ryoko Miyanaga, Nara (JP); Toshitaka Shimamoto, Osaka (JP); Kenji Harafuji, Osaka (JP); Yuzaburo Ban, Osaka (JP); Kiyoshi Ohnaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 149 days.

(21) Appl. No.: 11/063,533

(22) Filed: Feb. 24, 2005

(65) Prior Publication Data

US 2005/0142682 A1 Jun. 30, 2005

Related U.S. Application Data

(62) Division of application No. 10/434,063, filed on May 9, 2003, now Pat. No. 6,921,678, which is a division of application No. 10/021,006, filed on Dec. 19, 2001, now Pat. No. 6,586,774.

(30) Foreign Application Priority Data

Dec. 25, 2000 (JP) ............................. 2000-392003

(51) Int. Cl.
*H01L 21/00* (2006.01)
(52) U.S. Cl. ........................... 438/45; 438/47; 438/495
(58) Field of Classification Search ................... 438/45
See application file for complete search history.

(56) References Cited

U.S. PATENT DOCUMENTS

| 5,226,055 A | 7/1993 | Downey et al. |
| 5,543,354 A | 8/1996 | Richard et al. |
| 5,856,209 A | 1/1999 | Imanishi |

(Continued)

FOREIGN PATENT DOCUMENTS

JP          03-095926          4/1991

(Continued)

OTHER PUBLICATIONS

K. Kumakura et al., "Increased Electrical Activity of Mg-Acceptors in $Al_xGa_{1-x}N$/GaN Superlattices": Japanese Journal of Applied Physics, vol. 38 (1999), pp. L1012-L1014, Part 2, No. 9A/B, Sep. 15, 1999.

(Continued)

*Primary Examiner*—Jack Chen
(74) *Attorney, Agent, or Firm*—Nixon Peabody LLP; Donald R. Studebaker

(57) ABSTRACT

The method for fabricating a nitride semiconductor of the present invention includes the steps of: (1) growing a first semiconductor layer made of a first group III nitride over a substrate by supplying a first group III source and a group V source containing nitrogen; and (2) growing a second semiconductor layer made of a second group III nitride on the first semiconductor layer by supplying a second group III source and a group V source containing nitrogen. At least one of the steps (1) and (2) includes the step of supplying a p-type dopant over the substrate, and an area near the interface between the first semiconductor layer and the second semiconductor layer is grown so that the density of the p-type dopant locally increases.

11 Claims, 5 Drawing Sheets

U.S. PATENT DOCUMENTS

| | | |
|---|---|---|
| 5,888,886 A | 3/1999 | Sverdlov et al. |
| 6,046,464 A | 4/2000 | Schetzina |
| 6,060,335 A | 5/2000 | Rennie et al. |
| 6,172,382 B1 | 1/2001 | Nagahama et al. |
| 6,849,864 B1 | 2/2005 | Nagahama et al. |
| 6,921,678 B1 | 7/2005 | Ishibashi et al. |

FOREIGN PATENT DOCUMENTS

| | | |
|---|---|---|
| JP | 05-206586 | 8/1993 |
| JP | 08-97471 | 4/1996 |
| JP | 10-070082 | 3/1998 |
| JP | 10-107319 | 4/1998 |
| JP | 10-335757 | 12/1998 |
| JP | 2001-210867 A | 8/2001 |
| JP | 2002-198314 A | 7/2002 |

OTHER PUBLICATIONS

T. Nishida et al., "Selectively Enhanced Mg Incorporation into AlGaN Barrier Layer of Strained-Layer-Superlattice": *Proc. 61th Appl. Phys. Conf.*, Hokkaido, Japan, Sep. 2000, p. 286, 3a-Y-30 and an English translation thereof.

Van Zant, Peter; Microchip Fabrication (2000); McGraw-Hill, Fourth Edition; pp. 348-349.

English Translation of 61st Academic Lecture by The Japan Socient of Applied Physics, Lecture Note 3a-Y-30, No. 1, p. 286.

Notice of Reasons for Rejection, Mailed on Jan. 17, 2006.

"Notice of Reasons of Rejection", May 16, 2006, English Translation, Japan.

METHOD FOR FABRICATING NITRIDE SEMICONDUCTOR, METHOD FOR FABRICATING NITRIDE SEMICONDUCTOR DEVICE, AND NITRIDE SEMICONDUCTOR DEVICE

BACKGROUND OF THE INVENTION

The present invention relates to a method for fabricating a nitride semiconductor in which the density of a p-type dopant is positively increased, a method for fabricating a nitride semiconductor device, and a nitride semiconductor device fabricated by this method.

Prior art techniques of doping a nitride semiconductor device with a p-type dopant, in particular, magnesium (Mg) will be described.

In the first prior art (Japanese Journal of Applied Physics, 38, L1012, 1999), a superlattice (SL) layer having a cycle of 36 nm is disclosed for use as a p-type cladding layer paired with an n-type cladding layer to sandwich an active layer in the direction vertical to a substrate and confine light generated from the active layer. Each cycle of the superlattice layer is composed of an aluminum gallium nitride ($Al_{0.15}Ga_{0.85}N$) layer having a thickness of 24 nm and a gallium nitride (GaN) layer having a thickness of about 12 nm, for example. In this disclosure, the cycle of the superlattice layer is in the range of 9 nm to 100 nm.

Doping of the p-type cladding layer with magnesium (Mg) is performed uniformly over the entire superlattice layer. There is another disclosure reporting doping of either the AlGaN layers or the GaN layers. In either case, doping is uniform in each layer of the AlGaN layers and/or the GaN layers. This p-type cladding layer is formed on a substrate in a following manner. That is, using decompressed metal-organic vapor phase epitaxy (MOVPE) under a growth pressure of 300 Torr (1 Torr=133.322 Pa), a buffer layer made of aluminum nitride (AlN) is grown on a sapphire substrate of which the principal plane is the C plane at a substrate temperature of 400° C., and subsequently an undoped gallium nitride (GaN) layer having a thickness of 1 μm is grown on the buffer layer at a raised temperature. The substrate temperature is then raised to 1010° C., and the superlattice layer is grown.

By adopting the above method, strain occurs between the AlGaN layer and the GaN layer, causing generation of an internal electric field. This makes the acceptor level of Mg shallow and thus improves the activation yield of the acceptor. Therefore, the p-type carrier density (hole density) increases, and this advantageously reduces the threshold current of the laser device.

In the second prior art (Japanese Laid-Open Patent Publication No. 8-97471), disclosed is a first contact layer made of highly doped p-type GaN that is in contact with an electrode made of nickel (Ni). The first contact layer has a thickness of 50 nm and a Mg density in the range of $1 \times 10^{20}$ $cm^{-3}$ to $1 \times 10^{21}$ $cm^{-3}$. This prior art discusses that with this construction, the contact resistance can be reduced, and also the operating voltage of the device can be lowered by attaining a high carrier density.

In the second prior art, if the first contact layer is doped with Mg at an excessively high density, the hole density contrarily becomes low. To overcome this problem, a second contact layer made of p-type GaN having a Mg density lower than the first contact layer is formed on the surface of the first contact layer opposite to the electrode. According to this prior art, the second contact layer is desirably doped with Mg at a density in the range of $1 \times 10^{19}$ $cm^{-3}$ to $5 \times 10^{20}$ $cm^{-3}$ for the purpose of increasing the hole density.

The prior art techniques described above have the following problems. In the first prior art, the superlattice structure of the p-type cladding layer is yet insufficient in attaining low resistance. In the second prior art, although the upper portion of the p-type contact layer is doped with the p-type dopant at a high density, this contrarily decreases the hole density.

In addition, the conventional doping techniques find difficulty in providing a steep impurity profile. In particular, when a p-type cap layer is formed on an active layer, for example, an especially steep impurity profile is required for suppression of diffusion of a p-type dopant to the active layer.

SUMMARY OF THE INVENTION

An object of the present invention is attaining low resistance of a nitride semiconductor by increasing the p-type impurity density of the nitride semiconductor without increasing the doping amount and also providing a steep p-type impurity profile.

To attain the above object, according to the present invention, a first semiconductor layer made of a group III nitride is formed in contact with a second semiconductor layer made of a group III nitride different in composition from that of the first semiconductor layer, so that the density of a p-type dopant locally increases in an area near the heterojunction interface between the first and second semiconductor layers, that is, so that segregation of the p-type dopant occurs.

The method for fabricating a nitride semiconductor of the present invention includes the steps of: (1) growing a first semiconductor layer made of a first group III nitride over a substrate by supplying a first group III source and a group V source containing nitrogen; and (2) growing a second semiconductor layer made of a second group III nitride on the first semiconductor layer by supplying a second group III source and a group V source containing nitrogen, wherein at least one of the steps (1) and (2) includes the step of supplying a p-type dopant over the substrate, and an area near the interface between the first semiconductor layer and the second semiconductor layer is grown so that the density of the p-type dopant locally increases.

According to the method for fabricating a nitride semiconductor of the present invention, by forming a layered structure of the first semiconductor layer and the second semiconductor layer, the density of the p-type dopant in the layered structure increases compared with the conventional case. This makes it possible to attain low resistance, and also attain a steep p-type impurity profile in which only the layered structure has a high impurity density.

In the method for fabricating a nitride semiconductor of the present invention, preferably, the first group III source contains gallium, and the second group III source contains aluminum or indium. This further ensures increase in the density of the p-type dopant in the layered structure compared with the conventional case.

In the method for fabricating a nitride semiconductor of the present invention, preferably, the first group III source mainly contains gallium, and the second group III source contains gallium and either one of aluminum and indium. This further ensures increase in the density of the p-type dopant in the layered structure compared with the conventional case.

In the method for fabricating a nitride semiconductor of the present invention, when both the step (1) and the step (2) include the step of supplying a p-type dopant, the supply amount of the p-type dopant is preferably roughly the same in the two steps. Even in this uniform doping with the p-type dopant, it is possible to locally increase the density of the p-type dopant in an area near the interface between the first and second semiconductor layers.

In the method for fabricating a nitride semiconductor of the present invention, the supply amount of the p-type dopant is preferably different between the step (1) and the step (2). Even in this selective doping with the p-type dopant, it is possible to locally increase the density of the p-type dopant in an area near the interface between the first and second semiconductor layers.

In the method for fabricating a nitride semiconductor of the present invention, when the p-type dopant is supplied during the growth of the first semiconductor layer, the supply of the p-type dopant is preferably started ahead of the growth of the first semiconductor layer. Likewise, when the p-type dopant is supplied during the growth of the second semiconductor layer, the supply of the p-type dopant is preferably started ahead of the growth of the second semiconductor layer. By this advanced supply of the p-type dopant, the p-type dopant that is to be introduced into the semiconductor layer under growth can reach the growth surface of the semiconductor layer without delay. This ensures attainment of a steep impurity profile.

In the method for fabricating a nitride semiconductor of the present invention, the peak of the density of the p-type dopant is preferably located in the second semiconductor layer.

In the method for fabricating a nitride semiconductor of the present invention, preferably, the second group III source contains a plurality of group III elements, and the peak position of the density of the element having a smaller mole fraction among the plurality of group III elements is different from the peak position of the density of the p-type dopant.

In the method for fabricating a nitride semiconductor of the present invention, the density of the p-type dopant is preferably about $3 \times 10^{19}$ cm$^{-3}$ or less. This makes it possible to increase the effective acceptor density of the p-type dopant.

In the method for fabricating a nitride semiconductor of the present invention, the thickness of the second semiconductor layer is preferably about 1.5 nm or more. By this setting, it is possible to locate the peak position of the p-type dopant inside the second semiconductor layer.

The method for fabricating a nitride semiconductor device of the present invention includes the steps of: (1) growing an active layer made of a first nitride semiconductor on a substrate; (2) growing a p-type cap layer made of a second nitride semiconductor on the active layer for protecting the active layer; (3) growing a p-type cladding layer made of a third nitride semiconductor on the p-type cap layer; and (4) growing a p-type contact layer made of a fourth nitride semiconductor on the p-type cladding layer, wherein at least one of the steps (2), (3), and (4) includes the steps of: growing one layer made of a first group III nitride by supplying a first group III source and a group V source containing nitrogen; and growing another layer made of a second group III nitride on the one layer by supplying a second group III source and a group V source containing nitrogen, wherein at least one of the step of growing one layer and the step of growing another layer includes the step of supplying a p-type dopant to the substrate, and an area near the interface between the one layer and the another layer is grown so that the density of the p-type dopant locally increases.

According to the method for fabricating a nitride semiconductor device of the present invention, the method for fabricating a nitride semiconductor of the present invention is employed for formation of at least one of the p-type cap layer, the p-type cladding layer, and the p-type contact layer of the nitride semiconductor device. This makes it possible to attain low resistance and a steep impurity profile for at least one of the p-type cap layer, the p-type cladding layer, and the p-type contact layer.

In the method for fabricating a nitride semiconductor device of the present invention, preferably, the first group III source contains gallium, and the second group III source contains aluminum or indium.

In the method for fabricating a nitride semiconductor device of the present invention, the supply of the p-type dopant is preferably started before the growth of the one layer or the another layer.

In the method for fabricating a nitride semiconductor device of the present invention, the density of the p-type dopant in the p-type cap layer or the p-type cladding layer is preferably about $3 \times 10^{19}$ cm$^{-3}$ or less.

In the method for fabricating a nitride semiconductor device of the present invention, the thickness of the another layer is preferably about 1.5 nm or more.

In the method for fabricating a nitride semiconductor device of the present invention, preferably, the p-type contact layer contains indium, and the density of the p-type dopant in the p-type contact layer gradually decreases as the position is deeper from the surface of the p-type contact layer, and is about $3 \times 10^{19}$ cm$^{-3}$ or more at a position about 10 nm deep from the top surface.

The nitride semiconductor device of the present invention includes: an active layer made of a first nitride semiconductor formed on a substrate; a p-type cap layer made of a second nitride semiconductor formed on the active layer; a p-type cladding layer made of a third nitride semiconductor formed on the p-type cap layer; and a p-type contact layer made of a fourth nitride semiconductor formed on the p-type cladding layer, wherein at least one of the p-type cap layer, the p-type cladding layer, and the p-type contact layer has a multilayer structure of one layer made of a first group III nitride and another layer made of a second group III nitride different from the first group III nitride formed on the one layer, and the density of the p-type dopant locally increases in an area of the another layer near the interface with the one layer.

In the nitride semiconductor device of the present invention, preferably, the first group III source contains gallium, and the second group III source contains aluminum or indium. This makes it possible to attain a semiconductor layer device capable of oscillating short-wavelength laser light such as violet light.

In the nitride semiconductor device of the present invention, the density of the p-type dopant in the p-type cap layer or the p-type cladding layer is preferably about $3 \times 10^{19}$ cm$^{-3}$ or less.

In the nitride semiconductor device of the present invention, the thickness of the another semiconductor layer is preferably about 1.5 nm or more.

In the nitride semiconductor device of the present invention, preferably, the another layer of the p-type contact layer contains indium, and the density of the p-type dopant in the p-type contact layer gradually decreases as the position is deeper from the surface of the p-type contact layer, and is about $3 \times 10^{19}$ cm$^{-3}$ or more at a position about 10 nm deep from the top surface.

The 61st Annual Meeting Digest 3a-Y-30, September, 2000 of The Japan Society of Applied Physics describes a strained-layer superlattice (SLS) structure with each cycle of 5 nm composed of an $Al_{0.16}Ga_{0.84}N$ layer having a thickness of 2.5 nm and a GaN layer having a thickness of 2.5 nm. Both the AlGaN layers and the GaN layers are doped with Mg, a p-type dopant, uniformly at a density of $7 \times 10^{19}$ cm$^{-3}$. From analysis by secondary ion mass spectrometry (SIMS), a phenomenon that Mg is selectively incorporated in the AlGaN layers as the barrier layers is observed although the cycle is extremely short. In this case, however, because the resolution in the substrate depth direction is not sufficient, it is impossible to determine whether or not segregation of Mg has occurred in areas near the heterojunction interfaces.

DESCRIPTION OF THE PREFERRED EMBODIMENTS

Hereinafter, a preferred embodiment of the present invention will be described with reference to the accompanying drawings.

Figure 1:
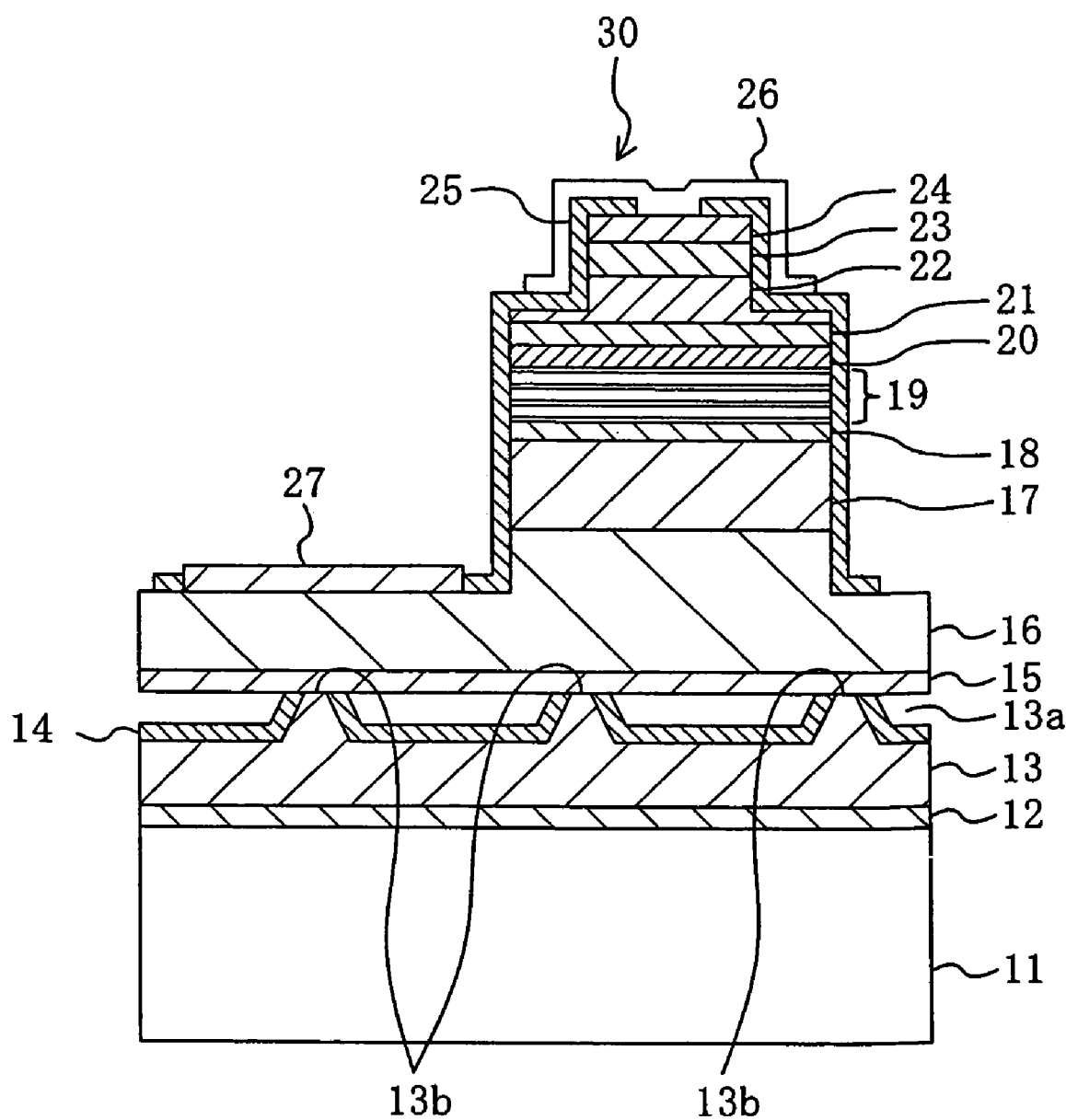
FIG. 1 is a structural cross-sectional view of a nitride semiconductor laser device in an embodiment of the present invention.

FIG. 1 shows a cross-sectional construction of a nitride semiconductor laser device in an embodiment of the present invention. Hereinafter, the construction of the semiconductor laser device will be described together with the fabrication process thereof. Metal-organic vapor phase epitaxy (MOVPE) is employed for crystal growth, and the growth pressure may be a decompressed pressure, the atmospheric pressure (1 atm), or a compressed pressure higher than the atmospheric pressure. Alternatively, the growth pressure may be changed to an appropriate pressure for each semiconductor layer. As a carrier gas for supplying a material gas to the substrate, at least an inert gas such as nitrogen or hydrogen is used.

Referring to FIG. 1, first, the growth temperature is set at about 500° C., and ammonia ($NH_3$) as a group V source and trimethylgallium (TMG) as a group III source are supplied to the principal plane of a substrate 11 made of sapphire, for example, to grow a buffer layer 12 made of gallium nitride (GaN) having a thickness of about 20 nm on the principal plane of the substrate 11.

The substrate temperature is then raised to about 1020° C., and $NH_3$ and TMG are supplied to grow an underlying layer 13 made of GaN having a thickness of about 1 µm on the buffer layer 12. A resist pattern (not shown) is then formed on the underlying layer 13 by photolithography. The resist pattern is composed of stripes having a width of about 3 µm extending in parallel with each other with a spacing of about 12 µm between the adjacent stripes. Using the resist pattern as a mask, the underlying layer 13 is dry-etched, to form a plurality of recesses 13a and a plurality of stripe-shaped convex portions 13b between the adjacent recesses 13a in the upper portion of the underlying layer 13. Silicon nitride ($SiN_X$) is then deposited over the entire surface of the underlying layer 13 with the recesses 13a, including the resist pattern and the convex portions 13b, by ECR sputtering, for example, to form a mask film 14. The portions of the mask film 14 located on the convex portions 13b are then removed by lifting off the resist pattern, to expose the top faces of the convex portions 13b.

Thereafter, the growth temperature is set at about 1000° C., and $NH_3$ and TMG are supplied to the underlying layer 13, to grow a selective growth layer 15 made of GaN having a thickness of about 3 µm by MOVPE again, using the exposed faces of the convex portions 13b of the underlying layer 13 as seed crystal.

Subsequently, with the growth temperature set at about 1000° C., $NH_3$, TMG, and an n-type dopant including silicon (Si), for example, are supplied, to grow an n-type contact layer 16 made of n-type GaN having a thickness of about 2 µm on the selective growth layer 15.

$NH_3$, TMG, trimethylaluminum (TMA), and an n-type dopant are then supplied to grow an n-type cladding layer 17 made of n-type aluminum gallium nitride ($Al_{0.07}Ga_{0.93}N$) having a thickness of about 0.7 µm on the n-type contact layer 16.

$NH_3$, TMG, and an n-type dopant are then supplied, to grow an n-type optical guide layer 18 made of n-type GaN having a thickness of about 100 nm on the n-type cladding layer 17.

The growth temperature is then lowered to about 810° C., and by supplying $NH_3$, TMG, and trimethylindium (TMI), a multiple quantum well (MQW) active layer 19 is formed on the n-type optical guide layer 18. The active layer 19 is composed of three cycles of semiconductor layers, and each cycle is composed of a well layer made of indium gallium nitride ($In_{0.1}Ga_{0.9}N$) having a thickness of about 3 nm and a barrier layer made of GaN having a thickness of about 6 nm on the well layer. The supply of TMI is stopped during the growth of the barrier layers.

Figure 2A:
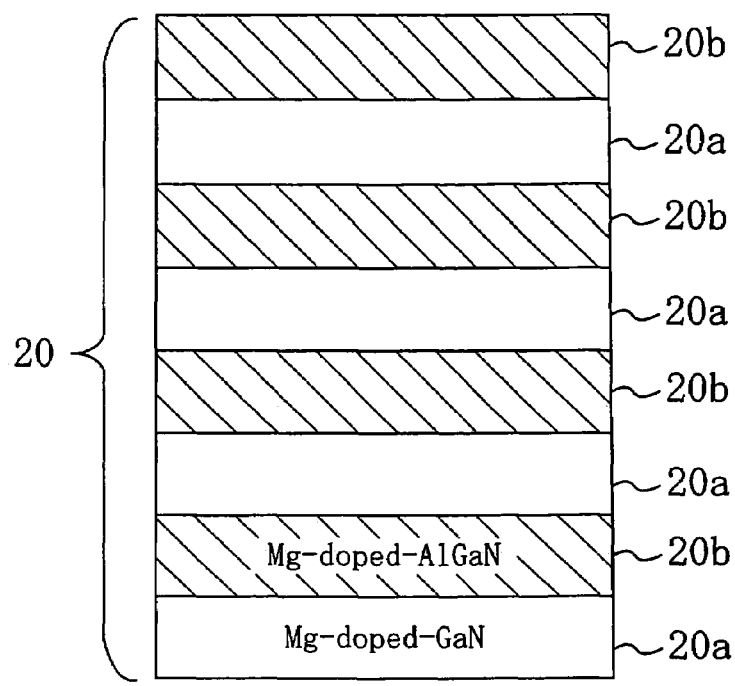
FIG. 2A is a structural cross-sectional view of a p-type superlattice cap layer of the nitride semiconductor laser device in the embodiment of the present invention.

While the growth temperature is raised again to about 1020° C., $NH_3$, TMG, and bis(cyclopentadienyl)magnesium ($Cp_2Mg$) containing magnesium as a p-type dopant are supplied to form a p-type superlattice cap layer 20 having a thickness of about 20 nm on the active layer 19. As shown in FIG. 2A, the superlattice cap layer 20 is composed of four cycles of semiconductor layers, and each cycle is composed of a first layer (well layer) 20a made of GaN having a thickness of about 2.5 nm and a second layer (barrier layer) 20b made of $Al_{0.3}Ga_{0.7}N$ having a thickness of about 2.5 nm. TMA is additionally supplied as another group III source during the growth of the second layers.

Subsequently, $NH_3$, TMG, and $Cp_2Mg$ are supplied to grow a p-type optical guide layer 21 made of p-type GaN having a thickness of about 100 nm on the p-type superlattice cap layer 20.

$NH_3$, TMG, and $Cp_2Mg$ are again supplied to form a p-type superlattice. cladding layer 22 having a thickness of about 0.7 μm on the p-type optical guide layer 21. The superlattice cladding layer 22 is composed of 140 cycles of semiconductor layers, and each cycle is composed of a first layer (well layer) made of GaN having a thickness of about 2.5 nm and a second layer (barrier layer) made of $Al_{0.14}Ga_{0.86}N$ having a thickness of about 2.5 nm. TMA is additionally supplied as another group III source during the growth of the second layers.

Subsequently, $NH_3$, TMG, and $Cp_2Mg$ are supplied to grow a p-type second contact layer 23 made of p-type GaN having a thickness of about 100 nm on the p-type superlattice cladding layer 22.

Figure 2B:
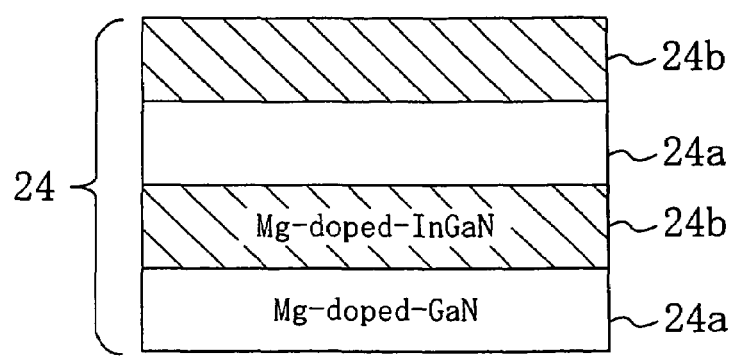
FIG. 2B is a structural cross-sectional view of a p-type first contact layer of the nitride semiconductor laser device in the embodiment of the present invention.

$NH_3$, TMG, and $Cp_2Mg$ are again supplied to form a p-type first contact layer 24 of a superlattice structure having a thickness of about 10 nm to 12 nm on the p-type second contact layer 23. As shown in FIG. 2B, the first contact layer 24 is composed of two cycles of semiconductor layers, and each cycle is composed of a first layer (barrier layer) 24a made of GaN having a thickness of about 2.5 nm to 3 nm and a second layer (well layer) 24b made of $In_{0.07}Ga_{0.93}N$ having a thickness of about 2.5 nm to 3 nm. TMI is additionally supplied as another group III source during the growth of the second layers.

Thus, the epitaxial layers constituting the semiconductor laser device are formed.

In this embodiment, the superlattice layers are doped with the p-type dopant uniformly throughout the growth of the first and second layers. That is, the supply amount of $Cp_2Mg$ is constant. Alternatively, the supply amount of the p-type dopant may be different between the first and second layers, adopting so-called modulation doping. Otherwise, so-called selective doping may be adopted, where only either the first layers or the second layers are doped. In these cases adopting non-uniform doping, also, the p-type dopant density increases in an area of each aluminum-or indium-containing layer located near the interface on the substrate side (the surface at which growth started). In selective doping, doping is preferably performed for the aluminum-or indium-containing layers.

Thereafter, the resultant epitaxial layers are etched using a mask covering a stripe-shaped resonator formation region so that the n-type contact layer 16 is exposed. Further, the p-type superlattice cladding layer 22, the p-type second contact layer 23, and the p-type first contact layer 24 in the resonator formation region formed by the above etching are etched to form a ridge 30 serving as a current injection region in the upper portion of the resonator formation region. The ridge 30 is preferably placed at a position deviated from areas right above the convex portions 13b of the underlying layer 13. By this placement, the device is less influenced by crystal dislocation that may occur in the selective growth layer 15, and this enables the current to flow in areas of the MQW active layer 19 and the like excellent in crystal quality.

Subsequently, a mask is formed to cover an electrode contact portion of the top surface of the p-type first contact layer 24 and an electrode contact portion of the top surface of the n-type contact layer 16. Under this mask, silicon dioxide ($SiO_2$) is deposited on the ridge 30 and the exposed surface of the resonator formation region by CVD or the like, to form a protection insulating film 25. The stripe width of the ridge 30 is about 3 μm to 5 μm.

A p-side electrode 26 made of a multilayer structure of nickel (Ni) and gold (Au) is then formed by evaporation, for example, to fill the opening of the protection insulating film 25 on the ridge 30 and also cover the p-sides of the ridge 30. An n-side electrode 27 made of a multilayer structure of titanium (Ti) and aluminum (Al) is then formed by evaporation, for example, to fill the opening of the protection insulating film 25 on the n-type contact layer 16.

In this embodiment, the p-type superlattice cap layer 20, the p-type superlattice cladding layer 22, and the p-type first contact layer 24 have a superlattice structure to attain low resistance of the p-type semiconductors and a steep impurity profile of the p-type dopant. Alternatively, at least one layer of the above three layers may have a superlattice structure according to the present invention.

In the thus-fabricated semiconductor laser device, when a voltage is applied between the p-side electrode 26 and the n-side electrode 27, holes are injected from the p-side electrode 26 while electrons are injected from the n-side electrode 27, toward the MQW active layer 19, resulting in electron-hole recombination at the MQW active layer 19. By this recombination, optical gains are generated and thus laser oscillation at a wavelength of about 404 nm occurs.

Hereinafter, the effectiveness of the superlattice structure according to the present invention used for the p-type superlattice cap layer 20, the p-type superlattice cladding layer 22, and the p-type first contact layer 24 will be described.

Figure 3A:
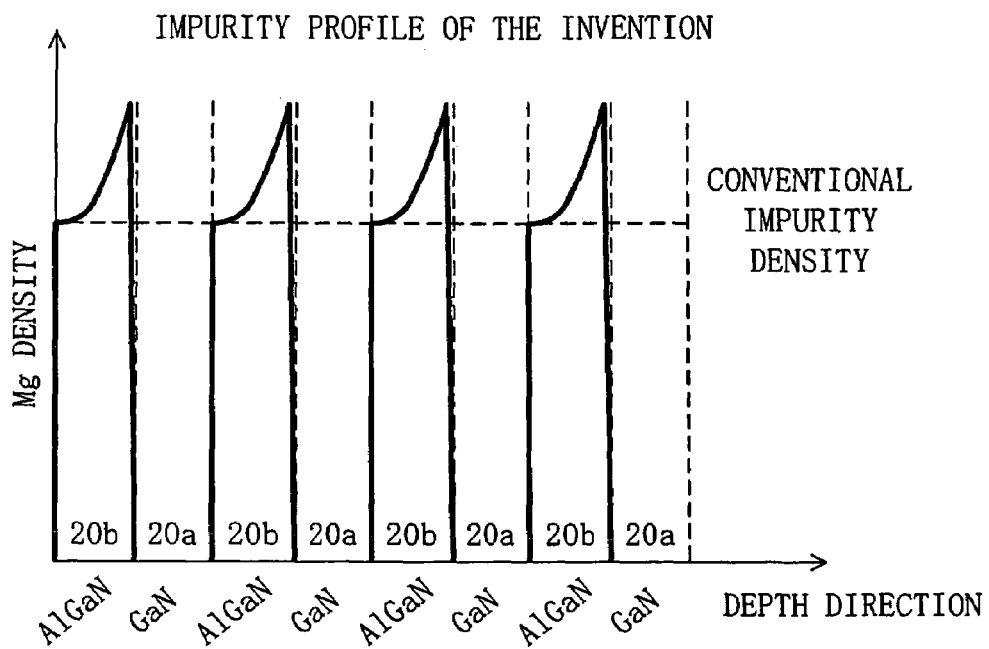
FIGS. 3A and 3B are graphs of impurity profiles by SIMS of the p-type superlattice cap layer of the nitride semiconductor laser device in the embodiment of the present invention, obtained when adopting selective doping (3A) and uniform doping (3B).

First, the p-type superlattice cap layer 20 and the p-type superlattice cladding layer 22 will be described. FIG. 3A shows an impurity profile in the substrate depth direction as the results of measurement by SIMS of Mg contained in the p-type superlattice cap layer 20 having four cycles each composed of the first layer 20a made of GaN and the second layer 20b made of $Al_{0.3}Ga_{0.7}N$. The growth of the semiconductor layers proceeds from the right side toward the left side as is viewed from the FIG. along the x-axis of the graph. The selective doping was adopted in the illustrated example, where $Cp_2Mg$ containing a p-type dopant was supplied only to the Al-containing second layers 20b.

As shown in FIG. 3A, the Mg density increases in areas of the Al-containing second layers 20b near the interfaces with the Al-free first layers 20a on the substrate side. This indicates that selective doping of Mg for the Al-containing second layers 20b is realized. In this way, a Mg density gradient is established in the superlattice structure, where the density gradient gradually decreases toward the top surface of the resultant substrate in each of the second layers 20b made of AlGaN. Moreover, as shown in FIG. 3A, as the lowest Mg density of the second layers 20b, a value in the same level as the impurity density obtained in the conventional method is secured.

Thus, the present inventors found the phenomenon that only by forming a heterojunction interface, a Mg density gradient is established near the interface although the supply amount of $Cp_2Mg$ per unit time is constant.

It has been confirmed that the peak of the Mg density of each of the second layers 20b is at a position apart by about 1.5 nm from the interface with the adjacent first layer 20a on the substrate side. In view of this, the thickness of the second layer 20b is preferably at least 1.5 nm so as to ensure that the peak of the impurity density is located inside the second layer 20b.

In this embodiment, the doping of Mg as the p-type dopant is preferably started at the growth of a semiconductor layer located in a region deeper than the p-type superlattice cap layer 20, that is, an underlying semiconductor layer. The reason is as follows. If the Mg doping is started simultaneously with the growth of the p-type superlattice cap layer 20, the material source of Mg, $Cp_2Mg$, fails to be immediately supplied to the substrate, causing delay of the doping. This makes it difficult to attain a desired impurity profile.

Figure 3B:
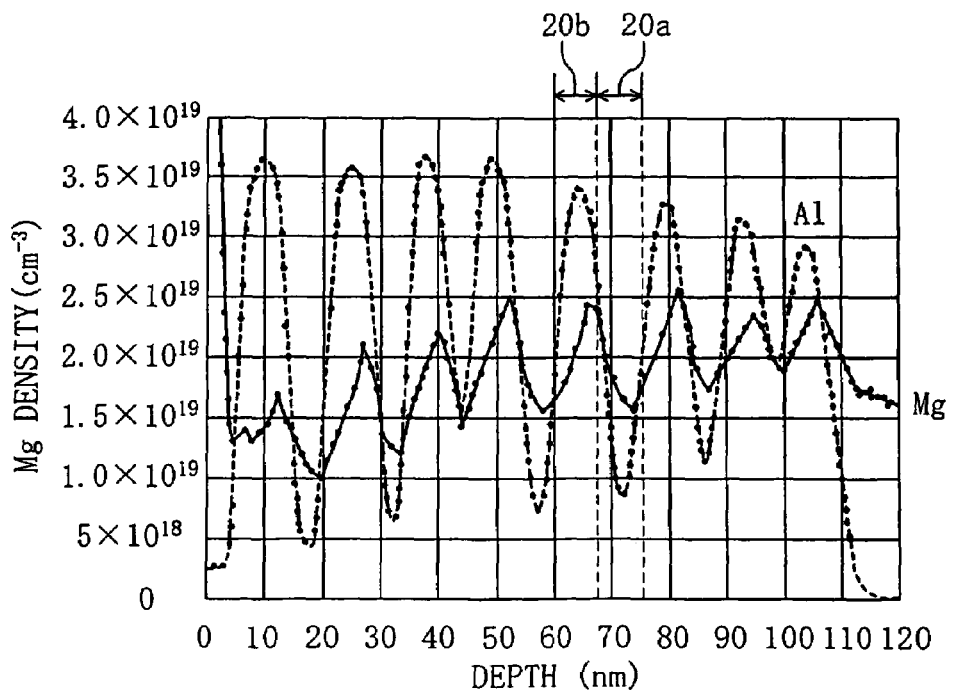

FIG. 3B shows an impurity profile as measured by SIMS observed when both the first layers 20a and the second layers 20b are uniformly doped with a p-type dopant. As shown in FIG. 3B, in spite of the uniform doping, the density of Mg as the p-type dopant increases in areas of the second layers 20b near the interfaces with the first layers 20a on the substrate side, exhibiting segregation near the interfaces. Note that the results shown in FIG. 3B were obtained using a superlattice semiconductor layer for measurement, which has eight cycles each composed of the first layer 20a and the second layer 20b.

The phenomenon that the density of a p-type dopant increases in an area of each Al-containing second layer near the interface with the Al-free first layer on the substrate side was also confirmed for the p-type superlattice cladding layer 22.

Next, the effectiveness of the p-type first contact layer 24 having the superlattice structure will be described.

Figure 4:
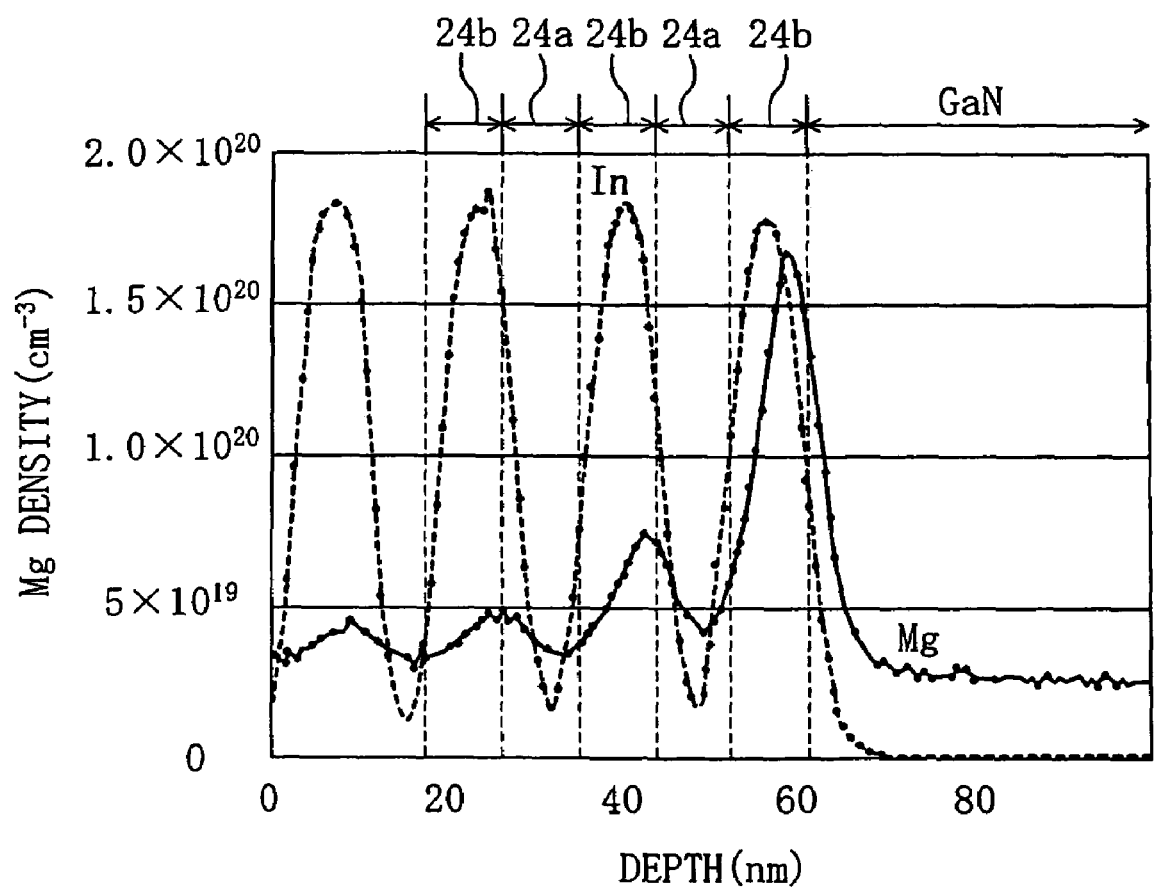
FIG. 4 is a graph of an impurity profile by SIMS of the p-type first contact layer of the nitride semiconductor laser device in the embodiment of the present invention.

FIG. 4 shows an impurity profile in the substrate depth direction as the results of measurement by SIMS of Mg contained in the p-type first contact layer 24 having the superlattice structure composed of the first layers 24a made of GaN and the second layers 24b made of $In_{0.07}Ga_{0.93}N$. From FIG. 4, it is observed that the density of Mg as the p-type dopant increases in areas of the second layers 24b near the interfaces with the first layers 24a on the substrate side, exhibiting segregation near the interfaces. This greatly increases the effective acceptor density. Note that the results shown in FIG. 4 were obtained using a superlattice semiconductor layer for measurement, which has four cycles each composed of the first layer 24a and the second layer 24b.

(Modification)

Hereinafter, a modification of the embodiment of the present invention described above will be described with reference to the relevant drawings. The first contact layer 24 in this modification is composed of a single layer made of p-type InGaN having a thickness of about 10 nm.

Figure 5A:
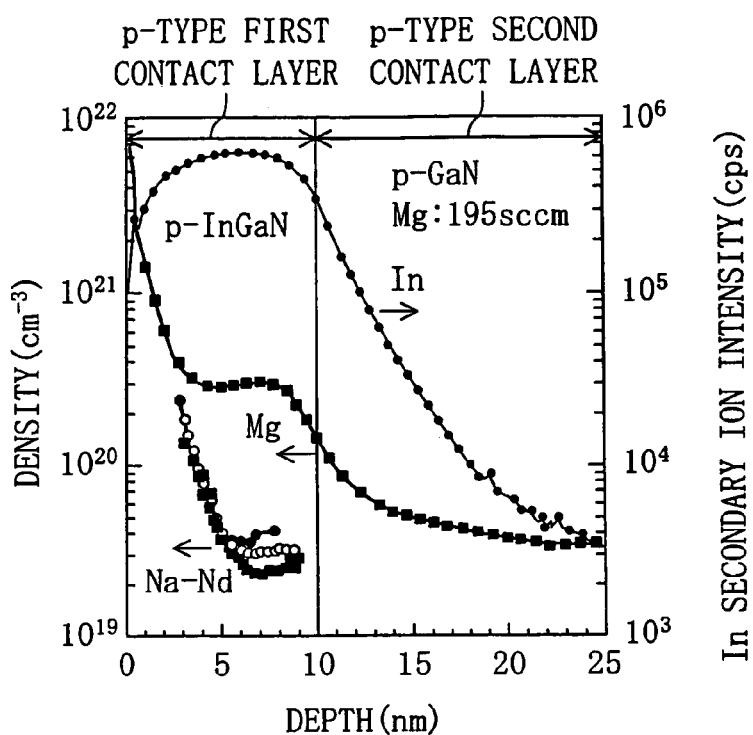
FIGS. 5A and 5B are graphs of density profiles of the p-type first contact layer and the p-type second contact layer of a semiconductor layer device in a modification of the embodiment of the present invention (5A) and a conventional semiconductor laser device (5B).

FIG. 5A shows density profiles in the substrate depth direction of the Mg density of the p-type first contact layer made of a single layer and the p-type second contact layer measured by SIMS, and the effective acceptor density (Na—Nd) measured at various frequencies by a capacitance-voltage (C-V) measurement method.

As shown in FIG. 5A, when a single-layer p-type InGaN layer is used for the p-type first contact layer, the Mg density in an area of the p-type first contact layer near the interface with the p-type second contact layer sharply increases in a convex shape even when the uniform doping is adopted where the supply amount of $Cp_2Mg$ is constant. Moreover, the Mg density sharply increases in an area of the p-type first contact layer within about 5 nm from the surface thereof. Thus, the effective acceptor density increases greatly in the area of the p-type first contact layer within about 5 nm from the surface and also increases a little in an area thereof over the range of 5 nm to 10 nm deep from the surface, compared with the conventional method, exhibiting improvement from the conventional method.

Figure 5B:
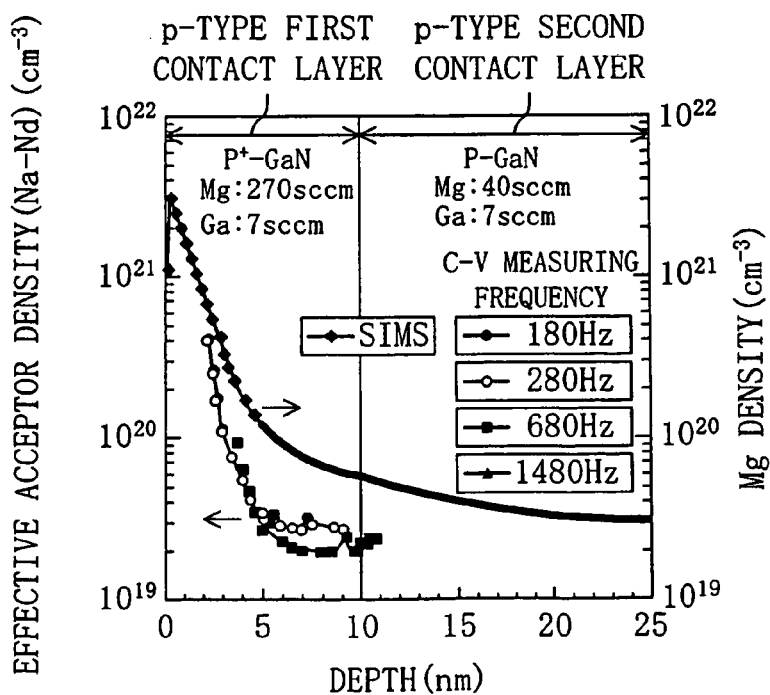

For comparison, FIG. 5B shows density profiles in the substrate depth direction of the Mg density of a p-type first contact layer made of $p^+$-GaN having a thickness of about 10 nm and a p-type second contact layer made of p-GaN formed by a conventional method, and the effective acceptor density.

The layers shown in FIG. 5B were formed in the following process. The supply amount of $Cp_2Mg$ was set at about 0.04 L/min (0° C., 1 atm) during the growth of the p-type second contact layer, and increased about seven times to about 0.27 L/min (0° C., 1 atm) during the growth of the p-type first contact layer. Despite this increase in supply amount, the Mg density shows no signs of sharp increase in the area of the p-type first contact layer near the interface with the p-type second contact layer, that is, the area over the range of 5 nm to 10 nm deep from the top of the resultant substrate, but only shows monotonous increase. The Mg density sharply increases in the area of the p-type first contact layer within 5 nm from the top surface. Thus, the effective acceptor density increases only in the area of the p-type first contact layer within 5 nm from the top surface.

Therefore, in the conventional method where the supply amount of $CP_2Mg$ is increased only during the growth of the p-type first contact layer, it is not possible to sharply increase the density of Mg as the dopant for the p-type first contact layer in the area of the p-type first contact layer near the interface with the p-type second contact layer.

The present inventors found the following. If the Mg doping density exceeds $3\times10^{19}$ $cm^{-3}$ in any of a GaN layer, an InGaN layer, and an AlGaN layer, Mg fails to substitute for original lattice positions of gallium, nitrogen, and the like in the semiconductor crystal, and thus the activation yield of Mg as the acceptor decreases.

In consideration of the above, the Mg doping densities of the p-type superlattice cap layer 20 and the p-type superlattice cladding layer 22 are preferably set at $3\times10^{19}$ $cm^{-3}$ or less so as to avoid loss of carriers injected into the laser device in non-radiative centers such as defects generated due to decrease in the activation yield of the acceptor.

As for the p-type first contact layer, there is no upper limit of the Mg density because it is more important to reduce the contact resistance against a metal electrode material.

The effect of increasing the density of a p-type dopant at the heterojunction interface works for the group III nitride semiconductors as a whole. Therefore, the group III elements used are not limited to aluminum, gallium, and indium, but the heterojunction interface may be established using a semiconductor of boron nitride (BN), for example.

The p-type dopant is not limited to magnesium (Mg), but zinc (Zn), calcium (Ca), or the like may be used.

The semiconductor laser device in this embodiment includes the selective growth layer 15 grown on the stripe-shaped convex portions 13b formed between the recesses 13a of the underlying layer 13 by an epitaxial lateral overgrowth (ELOG) method. The underlying layer 13 and the selective growth layer 15 are not essential for the present invention. However, by adopting the ELOG method, considerably good crystallinity is obtained for the n-type contact layer 16 and the subsequent semiconductor layers grown on the selective growth layer 15.

The method for growing a nitride semiconductor is not limited to MOVPE, but any methods capable of growing a nitride semiconductor, such as hydride vapor phase epitaxy (H-VPE) and molecular beam epitaxy (MBE), may be employed.

What is claimed is:

1. A method for fabricating a nitride semiconductor device comprising the steps of:
    (1) growing an active layer made of a first nitride semiconductor on a substrate;
    (2) growing a p-type cap layer made of a second nitride semiconductor on the active layer for protecting the active layer;
    (3) growing a p-type cladding layer made of a third nitride semiconductor on the p-type cap layer; and
    (4) growing a p-type contact layer lade of a fourth nitride semiconductor on the p-type cladding layer,
    wherein at least one of the steps (2), (3), and (4) includes the steps of:
    growing one layer made of a first group III nitride by supplying a first group III source and a group V source containing nitrogen; and
    growing another layer made of a second group III nitride on the one layer by supplying a second group III source of a plurality of group III elements and a group V source containing nitrogen,
    wherein at least one of the step of growing one layer and the step of growing another layer includes the step of supplying a p-type dopant to the substrate before the growth of the group III nitride layer begins such that an area near the interface between the one layer and the another layer is grown so that the density of the p-type dopant locally increases to a peak in the another layer at a position adjacent the interface.

2. The method of claim 1, wherein the peak position of the density of the element having a smaller mole fraction among the plurality of group III elements is different from the peak position of the density of the p-type dopant.

3. The method of claim 1, wherein the density of the p-type dopant in the p-type cap layer or the p-type cladding layer is about $3 \times 10^{19}$ cm$^{-3}$ or less.

4. The method of claim 1, wherein the thickness of the another layer is about 1.5 nm or more.

5. The method of claim 1, wherein the p-type contact layer contains indium, and the density of the p-type dopant in the p-type contact layer gradually decreases as the position is deeper from the surface of the p-type contact layer, and is about $3 \times 10^{19}$ cm$^{-3}$ or more at a position about 10 nm deep from the top surface.

6. The method of claim 1, wherein the first group III source mainly contains gallium, and the second group III source contains gallium and either one of aluminum and indium.

7. The method of claim 1, wherein when both the step of growing one layer and the step of growing another layer include the step of supplying a p-type dopant, the supply amount of the p-type dopant is roughly the same in the two steps.

8. The method of claim 1, wherein the supply amount of the p-type dopant is different between the step of growing one layer and the step of growing another layer.

9. The method of claim 1, wherein when the p-type dopant is supplied during the growth of the one layer, the supply of the p-type dopant is started ahead of the growth of the one layer.

10. The method of claim 1, wherein when the p-type dopant is supplied during the growth of the another layer, the supply of the p-type dopant is started ahead of the growth of the another layer.

11. The method of claim 1, wherein the density of the p-type dopant is about $3 \times 10^{19}$ cm$^{-3}$ or less.

* * * * *